United States Patent
Iino

(10) Patent No.: US 7,812,920 B2
(45) Date of Patent: Oct. 12, 2010

(54) PRODUCTION METHOD OF SUBSTRATE FOR LIQUID CRYSTAL DISPLAY USING IMAGE-CAPTURING AND REFERENCE POSITION DETECTION AT CORNER OF PIXEL PRESENT IN TFT SUBSTRATE

(75) Inventor: Jin Iino, Tokyo (JP)

(73) Assignee: V Technology Co., Ltd., Yokohama-shi (JP)

( * ) Notice: Subject to any disclaimer, the term of this patent is extended or adjusted under 35 U.S.C. 154(b) by 296 days.

(21) Appl. No.: 11/798,287

(22) Filed: May 11, 2007

(65) Prior Publication Data
US 2007/0211206 A1 Sep. 13, 2007

Related U.S. Application Data

(63) Continuation of application No. PCT/JP2005/019894, filed on Oct. 28, 2005.

(30) Foreign Application Priority Data
Nov. 12, 2004 (JP) .............................. 2004-328322

(51) Int. Cl.
*G02F 1/13* (2006.01)
*G01B 11/00* (2006.01)

(52) U.S. Cl. .................. 349/187; 349/24; 349/106; 348/362; 348/364; 356/401; 430/7

(58) Field of Classification Search ............... 349/24, 349/106, 187; 348/362, 364; 356/401; 430/7
See application file for complete search history.

(56) References Cited

U.S. PATENT DOCUMENTS 6,143,450 A 11/2000 Sobue et al.

6,798,516 B1 * 9/2004 Magome ..................... 356/401

(Continued)

FOREIGN PATENT DOCUMENTS

CN 1466011 1/2004

(Continued)

OTHER PUBLICATIONS

Chinese Office Action with partial English Translation dated Jul. 11, 2008.

*Primary Examiner*—John Heyman
(74) *Attorney, Agent, or Firm*—Finnegan, Henderson, Farabow, Garrett & Dunner, L.L.P.

(57) ABSTRACT

A production method of a substrate for a liquid crystal display in which an exposure pattern of a color filter or a black matrix is formed in a predetermined position of a TFT substrate at a high level of precision. Therefore the production method includes following steps: applying a photosensitive material for a color filter or a black matrix onto a TFT substrate; image-capturing a pixel region by an imaging unit while transporting the TFT substrate coated with the photosensitive material at a predetermined velocity by a transporting unit; detecting a reference position preset in the pixel region image-captured by the imaging unit at an image processing section of a control unit; and controlling irradiation timing of a light source in an exposure optical system by a lamp controller with reference to the detected reference position, and forming an exposure pattern of a color filter or a black matrix at a predetermined position of the TFT substrate.

2 Claims, 15 Drawing Sheets

U.S. PATENT DOCUMENTS

| | | | |
|---|---|---|---|
| 2002/0054231 A1* | 5/2002 | Masuyuki | 348/362 |
| 2003/0227607 A1* | 12/2003 | Kato et al. | 355/53 |
| 2004/0008332 A1 | 1/2004 | Nakaya et al. | |

FOREIGN PATENT DOCUMENTS

| | | |
|---|---|---|
| EP | 0 902 315 A2 | 3/1999 |
| JP | 07-306009 | 11/1995 |
| JP | 09-096712 | 4/1997 |
| JP | 11-084121 | 3/1999 |
| JP | 2000-180622 | 6/2000 |
| JP | 2002-250696 | 9/2002 |
| JP | 2004-070196 | 3/2004 |

* cited by examiner

| 20 | 40 | 60 |
| --- | --- | --- |
| 40 | 50 | 60 |
| 80 | 80 | 60 |

| 0 | 0 | 1 |
| --- | --- | --- |
| 0 | 1 | 1 |
| 1 | 1 | 1 |

| 1 | 1 | 1 |
|---|---|---|
| 1 | 0 | 0 |
| 1 | 0 | 0 |

PRODUCTION METHOD OF SUBSTRATE FOR LIQUID CRYSTAL DISPLAY USING IMAGE-CAPTURING AND REFERENCE POSITION DETECTION AT CORNER OF PIXEL PRESENT IN TFT SUBSTRATE

This application is a continuation of PCT/JP2005/019894, filed on Oct. 28, 2005.

BACKGROUND OF THE INVENTION

1. Field of the Invention

The present invention relates to a production method of a substrate for a liquid crystal display in which a color filter or a black matrix is directly formed on a TFT substrate on which a thin film transistor is formed for each pixel region, and in particular, relates to a production method of a substrate for a liquid crystal display in which a predetermined exposure pattern is formed in a predetermined position of the TFT substrate at a high level of precision, by detecting a reference position preset in a pixel region that has been image-captured while the TFT substrate was carried at a predetermined velocity, and controlling irradiation timing of exposure light.

2. Description of the Related Art

In general, a liquid crystal display has a configuration such that a liquid crystal is sealedly arranged between a pair of transparent substrates arranged opposing each other. In this case, one of the transparent substrates becomes a TFT substrate in which in an arrayed pixel region there are formed a pixel electrode and a thin film transistor, and a wiring for driving the thin film transistor is arranged around the pixel region. Moreover, the other of the transparent substrates becomes a color filter substrate in which a black matrix is formed so as to correspond to the thin film transistor and the wiring, a color filter is formed so as to cover pixels of the black matrix, and a common electrode is formed on the black matrix and the color filter. In the liquid crystal display of such a configuration, the line width of the black matrix is generally designed wide in consideration of alignment error in the above pair of transparent substrates. Therefore, in the conventional liquid crystal display, miniaturization of pixel regions has been difficult because it causes a reduction in the aperture ratio of the pixel of the black matrix.

On the other hand, a production method of a substrate for a liquid crystal display being a so called "color filter on TFT" that addresses the above problem, in which a color filter is formed so as to cover the thin film transistor and the wiring arranged around the pixel region of the TFT substrate, has been proposed (for example, refer to Japanese Unexamined Patent Publication No. 2004-70196).

However, in such a conventional production method of a substrate for a liquid crystal display, the exposure step for forming exposure patterns of the color filter and the black matrix on the pattern for the thin film transistor and the wiring of the TFT substrate is performed by mutually matching an alignment mark formed around the TFT substrate with an alignment mark of the mask of the color filter or the black matrix. Therefore, a high level of dimension precision has been required for positioning of each of the alignment marks and arrangement of each of the patterns. In particular in the case of a substrate for a large display, this requirement is even stricter, to have resulted in making positioning of each pattern more difficult. Accordingly, overlapping precision for the color filter and the black matrix formed on the pattern for the thin film transistor and the wiring cannot have been sufficiently improved. As a result, the line width of the black matrix cannot have been made narrow and thus, miniaturization of each of the pixel regions while suppressing a reduction in aperture ratio cannot have been successfully achieved. Therefore, a high definition liquid crystal display could not be realized.

SUMMARY OF THE INVENTION

Therefore, aiming to address such problems conventionally encountered, an object of the present invention is to provide a production method of a substrate for a liquid crystal display in which an exposure pattern of the color filter or the black matrix is formed in a predetermined position of the TFT substrate at a high level of precision.

In order to achieve the above object, a production method of a substrate for a liquid crystal display according to the present invention that forms a color filter or a black matrix on a TFT substrate in which a thin film transistor is provided for each pixel region, and a wiring for driving the thin film transistor is provided around the pixel region, comprises the steps of applying photosensitive material of the color filter or the black matrix onto the TFT substrate; image-capturing the pixel region while transporting the TFT substrate applied with the photosensitive material at a predetermined velocity; detecting a reference position preset in the pixel region that has been image-captured; and controlling irradiation timing of exposure light on the basis of the detected reference position, and forming the exposure pattern of the color filter or the black matrix in a predetermined position on the TFT substrate.

According to such a method, photosensitive material of the color filter or the black matrix is applied onto the TFT substrate in which the thin film transistor is provided for each pixel region, and the wiring for driving the thin film transistor is provided around the pixel region, the pixel region is image-captured while transporting the TFT substrate at a predetermined velocity, the reference position preset in the image-captured pixel region is detected, and irradiation timing of exposure light is controlled based on the reference position. As a result, the exposure pattern of the color filter or the black matrix is formed in the predetermined position on the TFT substrate at a high level of precision.

Furthermore, the step of image-capturing the pixel region is performed by an imaging unit, the image-capturing position of which is on a near side of an exposure pattern formation position in the direction of transporting the TFT substrate. As a result, the imaging unit performs an image-capturing to pickup the near side of the exposure pattern formation position in the direction of transporting the TFT substrate.

Furthermore, the imaging unit is one where photodetectors are arranged in a line. As a result, the imaging unit having the photodetectors arranged in a line, picks up one dimensional image data of a pixel region.

The step of detecting the reference position is carried out by binarization processing the image of the image-captured pixel region, and comparing image data of the binarized pixel region with image data corresponding to the preset reference position, and detecting a portion where both of the data match. As a result, the image of the image-captured pixel region is binarized, and the image data of the binarized pixel region is compared with the image data corresponding to the preset reference position, and the portion where both of the data match is detected as a reference position.

According to the invention, a pixel region is image-captured while transporting a TFT substrate provided with a thin film transistor and wiring, at a predetermined velocity, a reference position preset in an image-captured pixel region is detected, and exposure light irradiation timing is controlled based on the reference position. As a result, an exposure pattern of a color filter and a black matrix can be formed in a predetermined position on the TFT substrate at a high level of precision. Therefore, miniaturization of each of the pixel regions can be achieved and a high definition liquid crystal display can be realized while reducing the line width of the black matrix and suppressing a reduction in aperture ratio.

Moreover, according to a preferred embodiment of the invention, the near side of an exposure pattern formation position in the direction of transporting the TFT substrate is image-captured. As a result, an exposure pattern with no void or without missing any area can be formed for a predetermined exposure region.

Furthermore, according to a further preferred embodiment of the invention, the imaging unit in which the photodetectors are arranged in a line, obtains one dimensional image data of the pixel region. As a result, a cost increase in the imaging unit can be suppressed and data processing speed can be improved.

According to a still further embodiment of the invention, the image of the image-captured pixel region is binarized, and the binarized image data of the pixel region is compared with the image data corresponding to the preset reference position, and the portion where both of the data match is detected as a reference position. As a result, detection of the reference position can be processed in real time at high speed.

DESCRIPTION OF THE PREFERRED EMBODIMENTS

Hereunder, an embodiment of the present invention is described in detail, with reference to the accompanying drawings.

Figure 1:
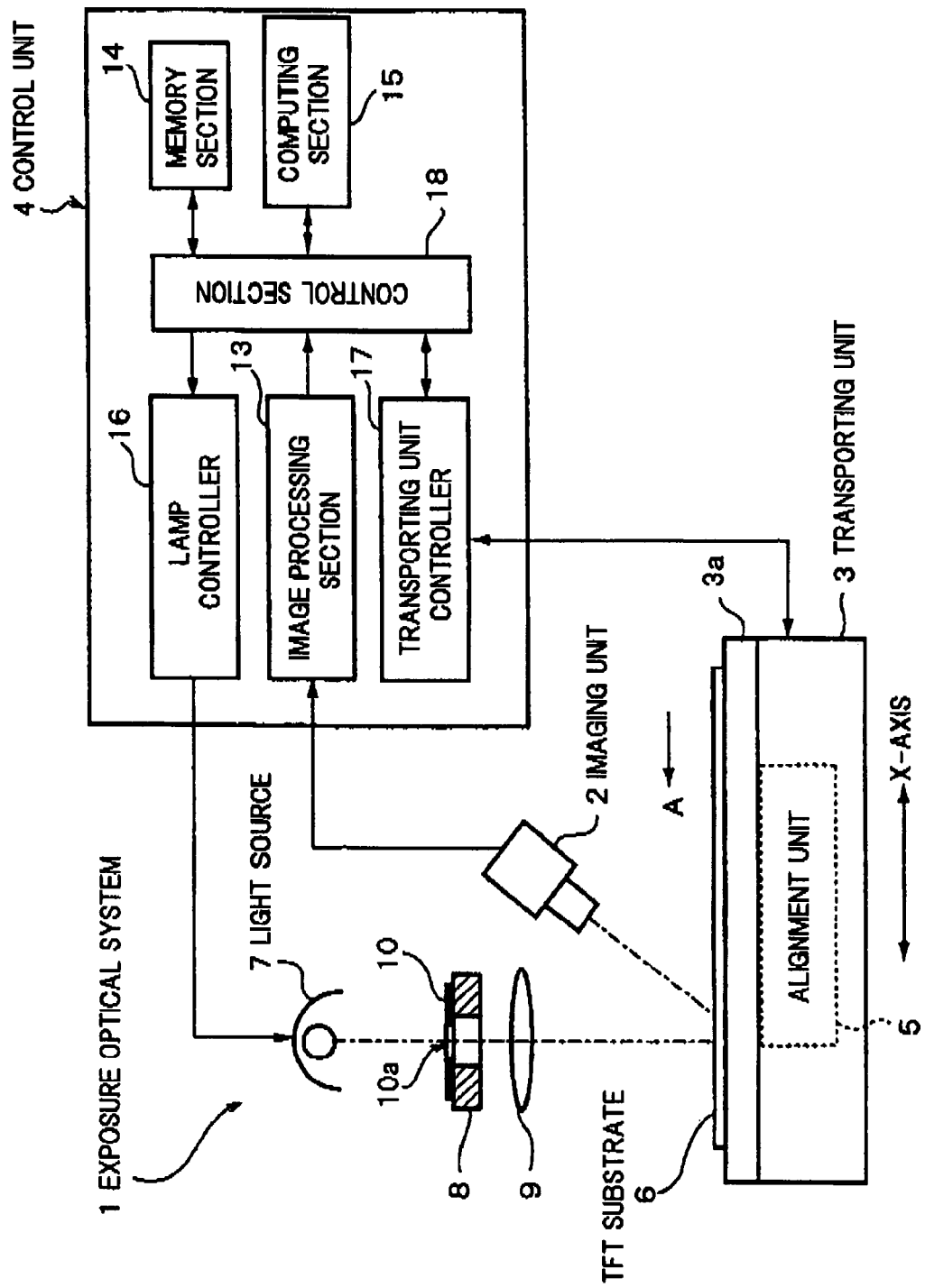
FIG. 1 is a conceptual drawing showing a configuration of an exposure apparatus to be used for carrying out a production method of a substrate for a liquid crystal display according to the present invention.

FIG. 1 is a conceptual block diagram showing a configuration of an exposure apparatus to be used for performing a production method of a substrate for a liquid crystal display according to the present invention. This exposure apparatus, irradiates exposure light with an exposure optical system, to expose a pattern of a color filter or a black matrix mask interposed on a path of the exposure optical system, onto a TFT substrate, and is provided with the exposure optical system 1, an imaging unit 2, a transporting unit 3, and a control unit 4.

The exposure optical system 1 irradiates exposure light on a TFT substrate 6 onto which a photosensitive colored resist (photosensitive material) of a color filter or a black matrix is applied by, e.g., coating, to expose a predetermined color filter or a black matrix pattern, and it is provided with a light source 7, a mask stage 8, and an imaging lens 9.

Figure 2:
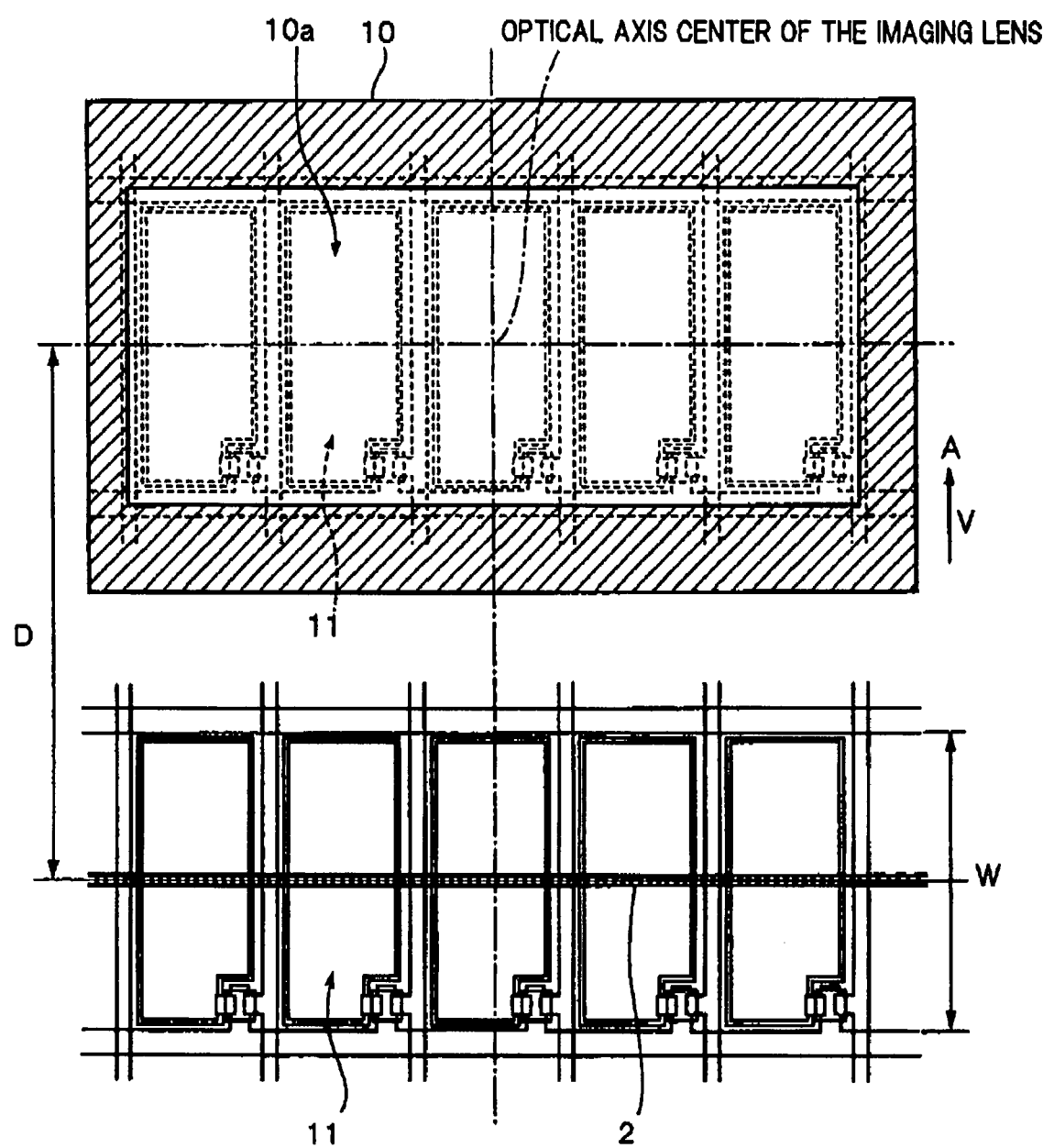
FIG. 2 is an explanatory drawing showing a relationship between an imaging unit and an aperture section of a mask, and an exposed region of a pixel area, of the above exposure apparatus.

The light source 7 is a lamp that emits ultraviolet light for example, and is a flash lamp that is controlled by the control unit 4 described later and emits light at intermittent intervals. Moreover, the mask stage 8 mounts and holds a mask 10 and is interposed on a light path between the light source 7 and the imaging lens 9 described later. The imaging lens 9 images an aperture section 10a of the mask 10 onto the TFT substrate 6, and it is arranged so as to face the TFT substrate 6. The mask 10 is parallel with the top surface of the TFT substrate 6 and is formed with rectangular aperture sections 10a, which are long in a direction orthogonal to the moving direction of the TFT substrate (arrow A direction). The aperture sections 10a are formed in a line in the direction orthogonal to arrow A as shown in FIG. 2 so as to correspond to five pixel regions 11 for example. The light source 7 may be a generic ultraviolet lamp instead of a flash lamp. In this case, irradiation of exposure light at intermittent intervals may be carried out, for example, by providing a shutter on the forward side in the irradiation direction of the light source 7 and controlling opening and closing of this shutter.

Moreover, there is provided the imaging unit 2, with an image-capturing position on the near side, in the moving direction of the TFT substrate 6 (arrow A direction), of the exposure position of the exposure optical system 1. This imaging unit 2 performs an image-capturing to pick up the pixel region pre-formed on the TFT substrate 6, and it is, for example, a line CCD in which photodetectors are arranged in one line. Here, as shown in FIG. 2, the image-capturing position of the imaging unit 2 and the exposure position of the exposure optical system 1 are distanced by a predetermined distance D. The pixel region 11 reaches the exposure position when a predetermined period of time has elapsed after the imaging unit 2 had completed image-capturing the pixel region 11. If the distance D is smaller, it is better. As a result, movement error of the TFT substrate 6 can be reduced, and the exposure position with respect to the pixel region 11 can be positioned more precisely. Moreover, as shown in the same drawing, the center of the aperture section 10a of the mask 10 is brought to be in alignment with the optical axis center of the imaging lens 9, and matches the image-capturing center of the imaging unit 2 in the transporting direction (arrow A direction) of the TFT substrate 6. Furthermore, in the vicinity of the imaging unit 2, there is provided an illumination unit (not shown in the drawing) so that the image-capturing region of the imaging unit 2 can be illuminated.

Furthermore, below the exposure optical system 1, there is provided the transporting unit 3. This transporting unit 3 is able to move in the X,Y axis directions with the TFT substrate 6 mounted on the stage, and a carrying motor (not shown in the drawing) is controlled by the control unit 4 to move a stage 3a. The X-axis direction corresponds to the transporting direction (arrow A direction) of the TFT substrate 6, and the Y-axis direction is orthogonal to the X-axis direction. Moreover, in the transporting unit 3, there are provided a position detection sensor and a velocity sensor such as an encoder and a linear sensor (not shown in the drawing), and of output of these sensors is fed back to the control unit 4 to enable position control and velocity control. Furthermore, in the transporting unit 3, there is provided an alignment unit 5 that computes a deviance between an expected exposure position with respect to a pixel line and the exposure position of the aperture section 10a of the mask 10, based on a reference position, and is able to shift the rotation angle ◻ and the position in the Y-axis direction of the stage 3a to correct the deviance. The angle ◻ of the stage 3a can be detected by an angle sensor.

Moreover, there is provided the control unit 4 to which the light source 7, the imaging unit 2, and the transporting unit 3 are connected. This control unit 4 controls the entire units to operate appropriately, and it is provided with: an image processing section 13 that detects the reference position preset in the pixel region 11 that has been image-captured by the imaging unit 2; a memory section 14 that stores CAD data of the pixel region 11 and data of lookup tables that correspond to the reference position; a computing section 15 that computes time t required for the pixel region 11 to move from the image-capturing position to the exposure position by using distance D between the image-capturing position and the exposure position and movement velocity V of the TFT substrate 6, and that computes a positional deviance between the expected exposure position (hereunder, referred to as "exposed region") found based on the reference position, and the aperture section 10a of the mask 10; a lamp controller 16 that controls irradiation timing of exposure light of the light source 7 based on the reference position; a transporting unit controller 17 that drives the stage 3a of the transporting unit 3 at a predetermined velocity in the X-axis direction and that drives the alignment unit 5 provided in the transporting unit 3; and a control section 18 that integrates and controls the entire units.

Figure 3:
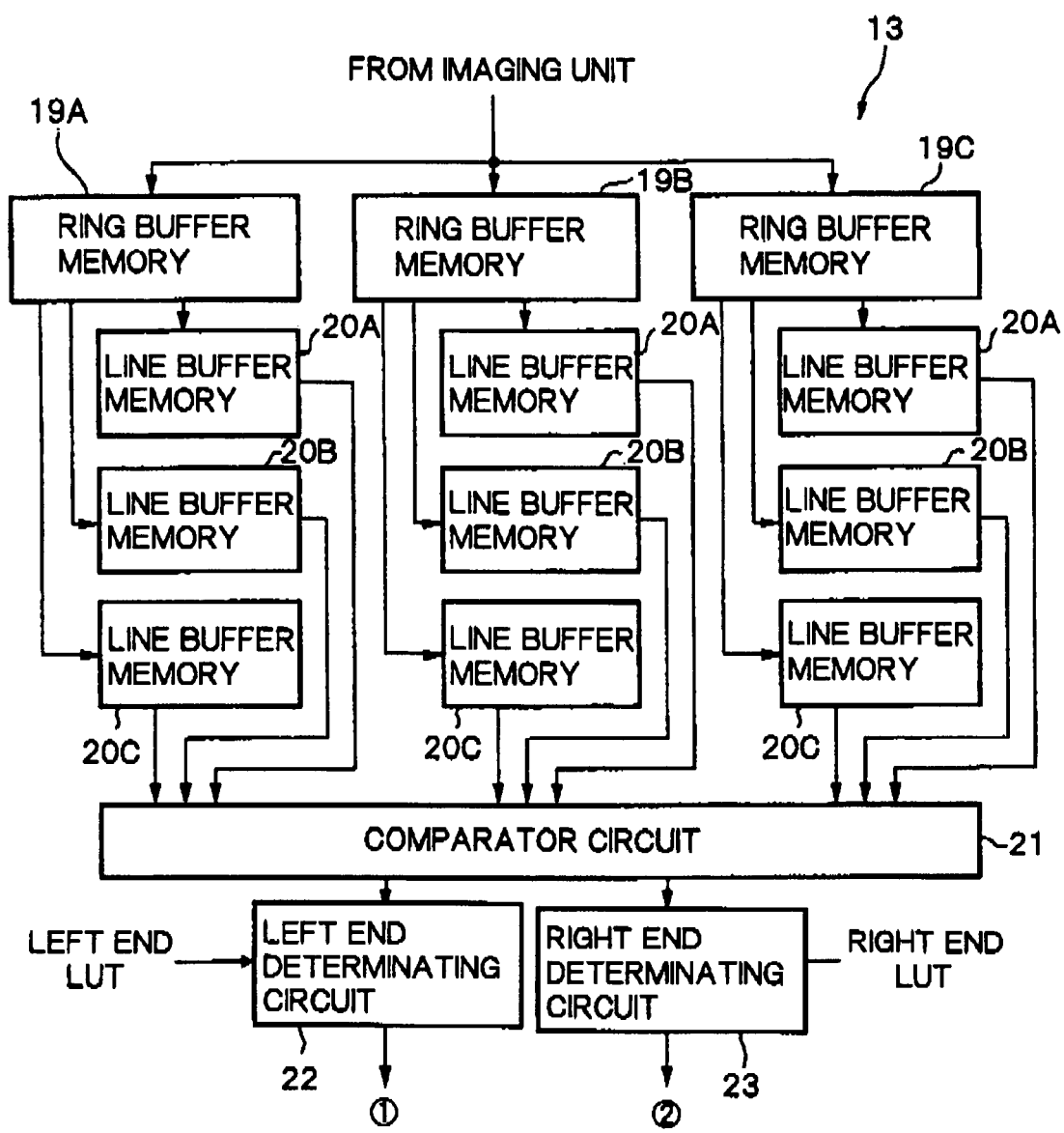
FIG. 3 is a block diagram showing a first half of a processing system in an internal configuration of an image processing section of the above exposure apparatus.
Figure 4:
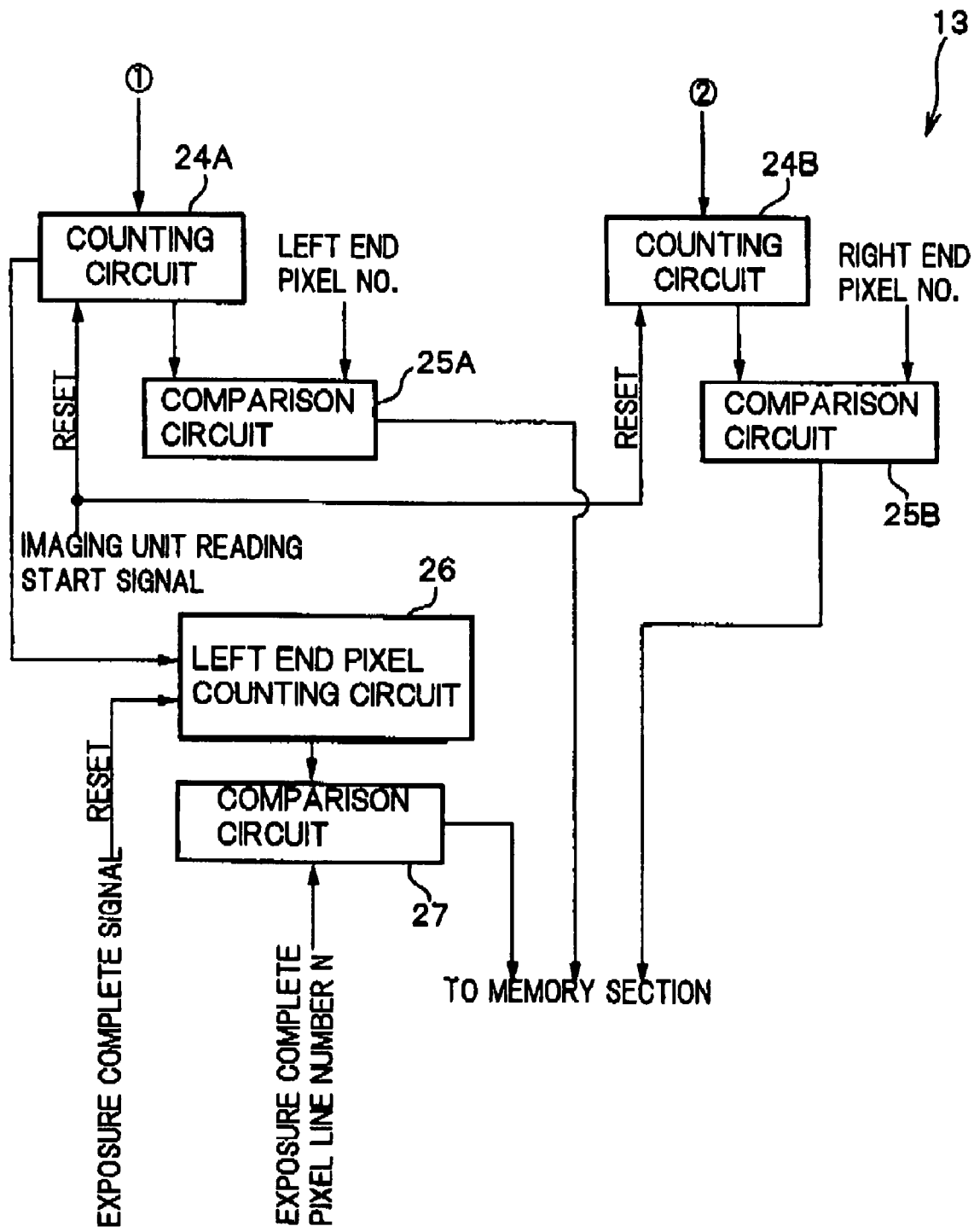
FIG. 4 is a block diagram showing a second half of a processing system in an internal configuration of an image processing section of the above exposure apparatus.

FIG. 3 and FIG. 4 are block diagrams showing one configuration example of the image processing section 13. As shown in FIG. 3, the image processing section 13 is provided with: for example three ring buffer memories 19A, 19B, 19C connected in parallel; for example three line buffer memories 20A, 20B, 20C respectively connected in parallel to each of the ring buffer memories 19A, 19B, 19C; a comparator circuit 21 that is connected to the line buffer memories 20A, 20B, 20C and that compares a data of grey level with a predetermined threshold value to eventually binarize such a gray level data and outputs it; a left end determination circuit 22 that compares the output data from nine of the line buffer memories 20A, 20B, 20C with a lookup table (hereunder, referred to as "left end LUT") of image data that corresponds to a first reference position that is obtained from the memory section 14 shown in FIG. 1 and determines the left end of the exposure region, and outputs a left end determination result when both of the data are matched; and a right end determination circuit 23 that compares the output data from nine of the line buffer memories 20A, 20B, 20C with a lookup table (hereunder, referred to as "right end LUT") of image data that corresponds to a second reference position that is obtained from the memory section 14 shown in FIG. 1 and determines the right end of the exposure region, and outputs a right end determination result when both of the data are matched.

Moreover, as shown in FIG. 4, the image processing section 13 is provided with: a counting circuit 24A that receives the left end determination result input and counts the number of matching times of the image data corresponding to the first reference position; a comparison circuit 25A that compares the output of the counting circuit 24A with a left end pixel number obtained from the memory section 14 shown in FIG. 1, and outputs a left end specifying signal to the memory section 14 when both of the values match with each other; a counting circuit 24B that receives the right end determination result input and counts the number of matching times of the image data corresponding to the second reference position; a comparison circuit 25B that compares the output of the counting circuit 24B with a right end pixel number obtained from the memory section 14, and outputs a right end specifying signal to the memory section 14 when both of the values match with each other; a left end pixel counting circuit 26 that counts a number n of left end pixels based on the output of the counting circuit 24A; and a comparison circuit 27 that compares the output from the left end pixel counting circuit 26 with an exposure complete pixel line number N obtained from the memory section 14, and outputs an exposure complete pixel line number specifying signal when both of the values match with each other, to the memory section 14. When a reading operation of the imaging unit 2 starts, a reading start signal resets the counting circuits 24A and 24B. Moreover, the left end pixel counting circuit 26 is reset by an exposure complete signal when exposure on the pre-specified region is completed.

Next, the production method of a substrate for a liquid crystal display is described.

Figure 5A:
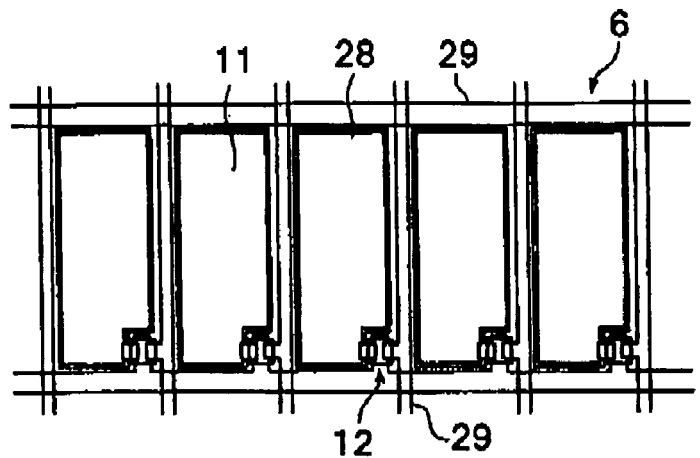
FIG. 5 is a plan view for explaining production steps of the production method of a substrate for a liquid crystal display according to the present invention.
Figure 6A:
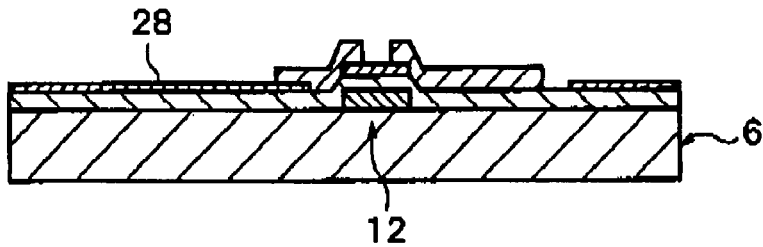
FIG. 6 is a sectional view for explaining the above production steps.

First, in a first step, as shown in FIG. 5A and FIG. 6A, on the TFT substrate, a TFT 12 and a pixel electrode 28 are formed in the arrayed pixel region 11 by employing a commonly known technique, and a wiring 29 comprising a gate electrode line (horizontal wiring) and a data electrode line (vertical wiring) that drive the TFT 12 is arranged around the pixel region to create the TFT substrate 6.

Figure 6B:
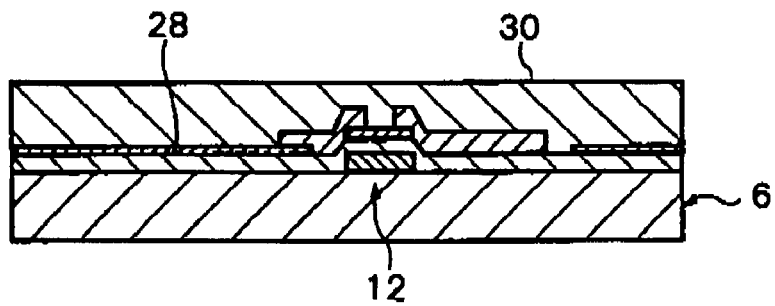

In a second step, as shown in FIG. 6B, a planarizing layer 30 made for example from an organic film is formed so as to cover the TFT substrate 6.

Figure 6C:
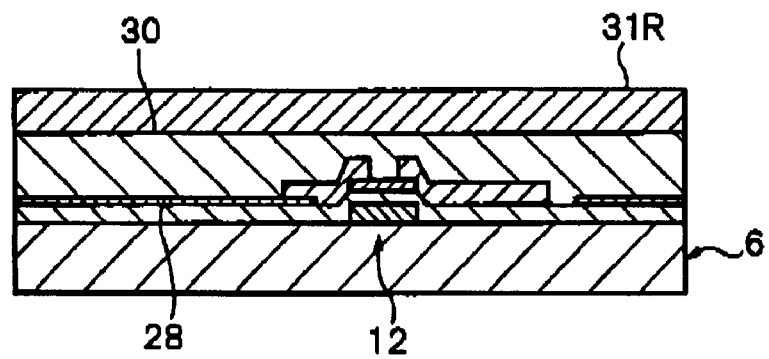

In a third step, as shown in FIG. 6C, for example, a negative type red photosensitive colored resist (photosensitive material) is applied by, e.g., coating onto the planarizing layer 30. Then, using the above exposure apparatus, an exposure pattern of a red (R) color filter 31R is formed. Hereunder, an exposure sequence to be carried out using the exposure apparatus is described, with reference to the flow chart shown in FIG. 7.

First, when the exposure apparatus is powered on, the imaging unit 2, the control unit 4 shown in FIG. 1, and further the illumination unit (not shown), start up and go into a standby state. Next, the TFT substrate 6 is mounted on the stage 3a of the transporting unit 3, and when a switch (not shown in the drawing) is operated, the transporting unit 3 is controlled by the transporting unit controller 17 of the control unit 4 to carry the TFT substrate 6 in the arrow A direction at constant velocity. When the TFT substrate 6 has reached the image-capturing position of the imaging unit 2, an exposure operation is executed according to the following sequence.

Figures 8A, 8B, 8C:
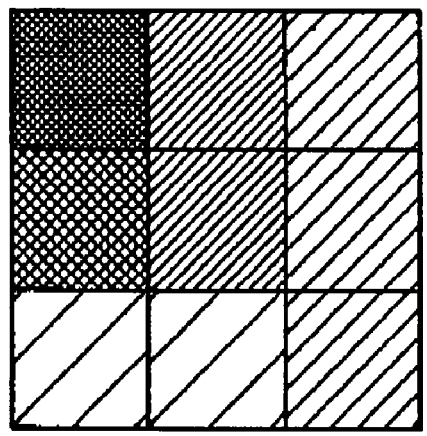
FIG. 8 is an explanatory drawing showing a method for binarizing an output of a ring buffer memory of the above image processing section.

First, in step S1, the imaging unit 2 captures and picks up an image of the pixel region 11. This picked-up image data is transmitted so as to be taken by three of the ring buffer memories 19A, 19B, 19C of the image processing section 13 shown in FIG. 3 and to be processed therein. Then, three latest data are output from the respective ring buffer memories 19A, 19B, 19C. In this case, for example, the ring buffer memory 19A outputs the data before the last data, the ring buffer memory 19B outputs the last data, and the ring buffer memory 19C outputs the latest data. Furthermore, these respective data, by means of the three line buffer memories 20A, 20B, 20C, allocate for example images of a 3 by 3 CCD pixel region to the same lock (time base). The result is obtained as an image as shown for example in FIG. 8A. When this image is digitalized, as shown in FIG. 8B, it corresponds to 3 by 3 values. These digitalized images are aligned on the same clock so that they are compared with the threshold value in the comparator circuit and binarized. For example, if the threshold value is "45", the image shown in FIG. 8A is binarized as shown in FIG. 8C.

Figure 7:
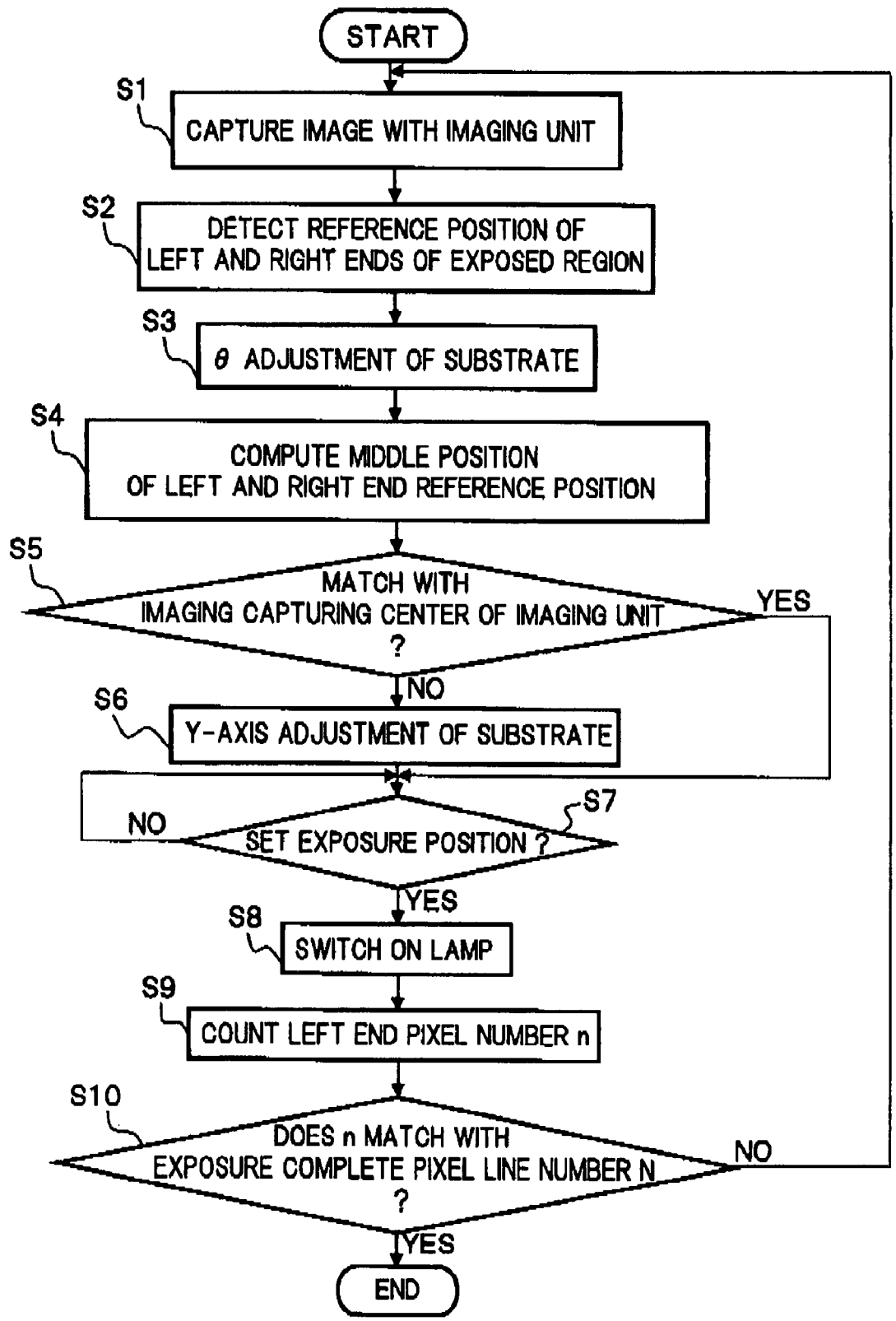
FIG. 7 is a flow chart for explaining an exposure sequence according to the above exposure apparatus.

In step S2 of FIG. 7, reference positions of left and right ends of the exposed region are detected. More specifically, detection of the reference positions is carried out by comparing the above binarized data with the left end LUT data obtained from the memory section 14 shown in FIG. 1 in the left end determination circuit 22.

Figures 9A, 9B:
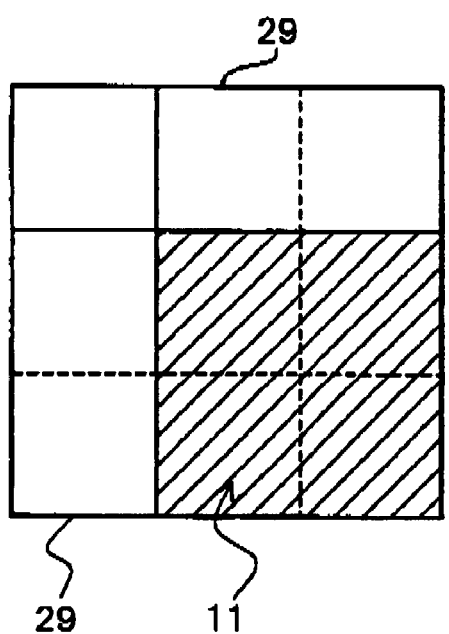
FIG. 9 is an explanatory drawing showing an image in a first reference position pre-set in the pixel region of the TFT substrate, and a lookup table thereof.
Figure 12:
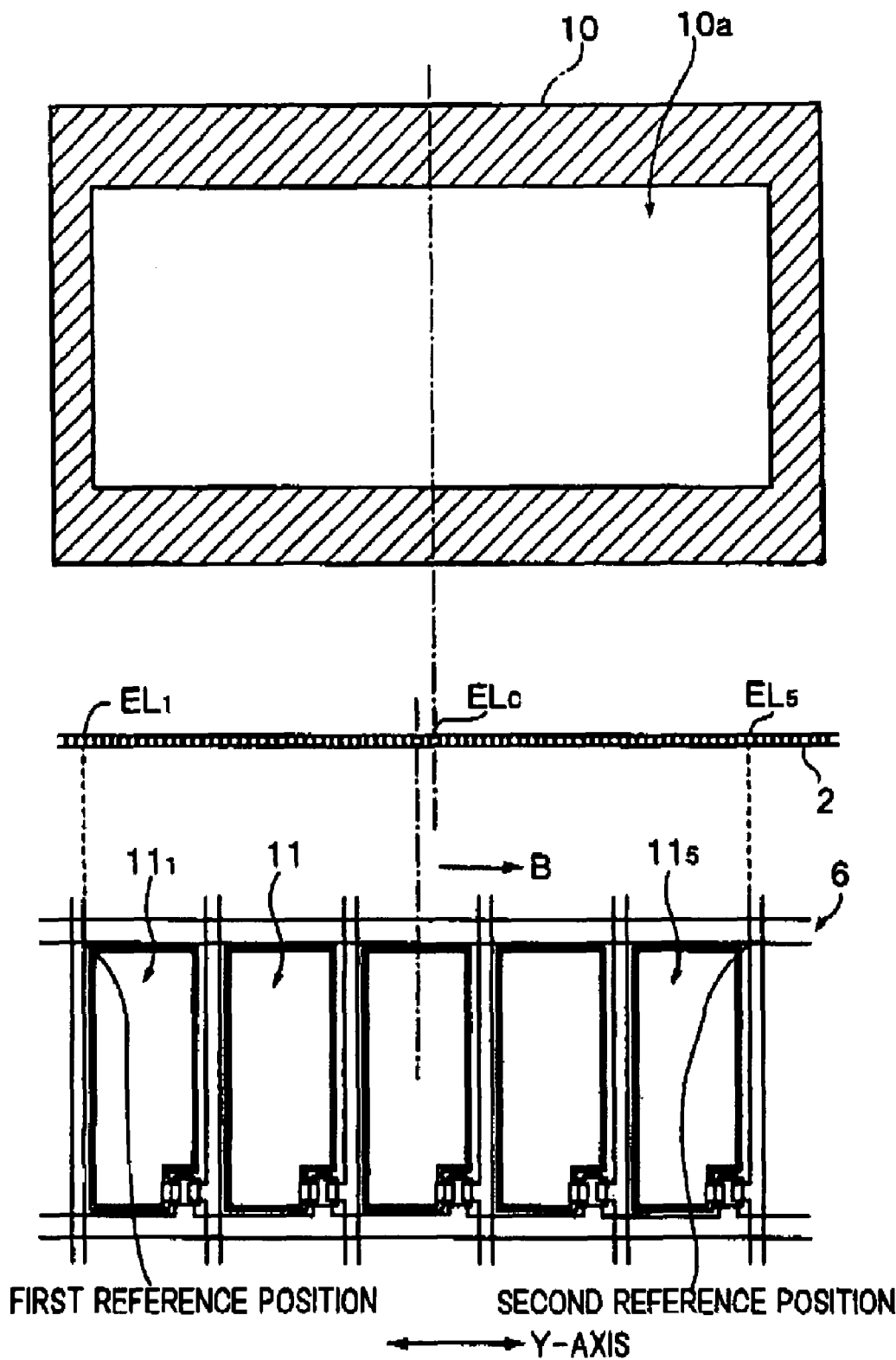
FIG. 12 is a plan view for explaining alignment adjustment in the Y-axis direction of the TFT substrate.

For example, in the case where the first reference position that specifies the left end of the exposed region is set in an intersection section of the wiring 29 of the top left corner section of the pixel region 11 as shown in FIG. 9A, the left end LUT becomes as shown in FIG. 9B, and the left end LUT data at this time becomes "111100100". Therefore, the above binarized data is compared with the left end LUT data "111100100", and when both of the data match, the image data obtained in the imaging unit 2 is determined be the first reference position, and the left end determination circuit 22 outputs a left end determination result. As shown in FIG. 12, for example, when five of the pixel regions 11 are lined up, the top left corner section of each of the pixel regions 11 corresponds to the first reference position.

Based on the above determination result, the counting circuit 24A shown in FIG. 4 counts the number of matching times. Then the comparison circuit 25A compares this count number with the left end pixel number obtained from the memory section 14 shown in FIG. 1, and when both of the values match, a left end specifying signal is outputted to the memory section 14. In this case, as shown in FIG. 12, for example, when a first pixel region $11_1$ is determined as the left end pixel number, the top left corner section of this pixel region $11_1$ is set as the first reference position. Accordingly, an element address in the line CCD of the imaging unit 2 that corresponds to the first reference position, for example $EL_1$ is stored in the memory section 14.

Figures 10A, 10B:
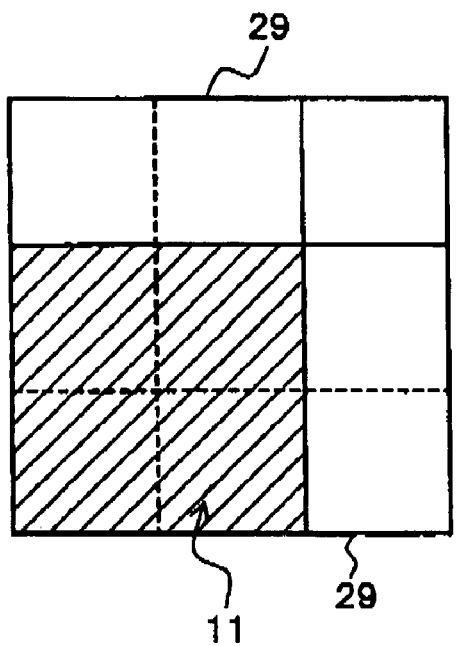
FIG. 10 is an explanatory drawing showing an image in a second reference position preset in the pixel region of the TFT substrate, and a lookup table thereof.

On the other hand, the above binarized data is compared with the right end LUT data obtained from the memory section 14 shown in FIG. 1 in the right end determination circuit 23. For example, in the case where the second reference position that specifies the right end of the exposed region is set in an intersection section of the wiring 29 of the top right corner section of the pixel region 11 as shown in FIG. 10A, the right end LUT becomes as shown in FIG. 10B, and the right end LUT data at this time becomes "111001001". Therefore, the above binarized data is compared with the right end LUT data "111001001", and when both of the data match, the image data obtained in the imaging unit 2 is determined be the right end reference position of the exposed region, i.e., a second reference position, and the right end determination circuit 23 outputs a right end determination result. As with the case described above, as shown in FIG. 12, for example, when five of the pixel regions 11 are lined up, the top right corner section of each of the pixel region 11 corresponds to the second reference position.

Based on the above determination result, the counting circuit 24B shown in FIG. 4 counts the number of matching times. Then the comparison circuit 25B compares this count number with the right end pixel number obtained from the memory section 14 shown in FIG. 1, and when both of the values match, a right end specifying signal is output to the memory section 14. In this case, as shown in FIG. 12, for example, when a fifth pixel region $11_5$ is determined as the right end pixel number, the top right corner section of this pixel region $11_5$ is set as the second reference position. Accordingly, an element address in the line CCD of the imaging unit 2 that corresponds to the second reference position, for example $EL_5$, is stored in the memory section 14. When the reference positions of the left end and the right end of the exposed region have been detected as described above, control proceeds to step S3 of FIG. 7.

Figure 11:
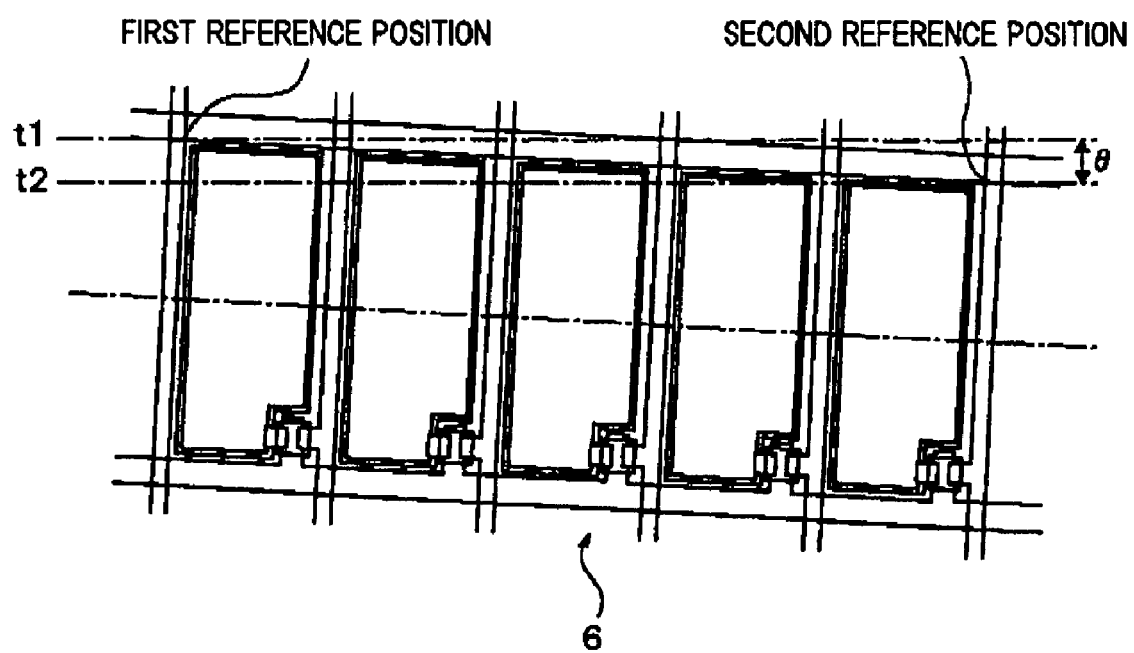
FIG. 11 is a plan view for explaining inclination adjustment of the TFT substrate.

In step S3, as shown in FIG. 11, based on detection times $t_1$ and $t_2$ for the first reference position and the second reference position, the inclination θ of the TFT substrate 6 with respect to the transporting direction is computed in the computing section 15. For example, taking V as the transporting velocity, the deviance amount between the first reference position and the second reference position in the transporting direction is $(t_1-t_2)$ V. Moreover, the distance between the first reference position and the second reference position can be found from $K(EL_5-EL_1)$ based on the element address $EL_1$ of the imaging unit 2 corresponding to the first reference position and the element address $EL_5$ of the imaging unit 2 corresponding to the second reference position, as shown in FIG. 12. Here, K is an image-capturing magnification factor. Therefore, the inclination angle θ of the TFT substrate 6 can be found by computing the following.

$$θ=\arctan(t_1-t_2)V/\{K(EL_5-EL_1)\}$$

The above distance may be found from CAD data.

When the inclination angle θ has been computed, the alignment unit 5 of the transporting unit 3 is controlled and driven by the transporting unit controller 17 and the stage $3a$ is rotated by θ. As a result, as shown in FIG. 12, each side of the exposed region of the pixel region 11 becomes parallel with each side of the aperture section $10a$ of the mask 10.

Next, in step S4 of FIG. 7, a middle position between the first reference position and the second position is computed by the computing section 15. More specifically, based on the element address $EL_1$ of the imaging unit 2 corresponding to the first reference position and the element address $EL_5$ of the imaging unit 2 corresponding to the second reference position that are read from the memory section 14, the above middle position can be found from $(EL_1+EL_5)/2$.

Next, in step S5, whether or not the middle position found in step S4 matches with the image-capturing center of the imaging unit 2 (element address $EL_C$) is determined. Here, if it is determined as "NO", control proceeds to step S6.

In step S6, the alignment unit 5 is controlled by the transporting unit controller 17 to move the stage $3a$, and as shown in FIG. 12, the TFT substrate 6 is moved by $K(EL_C-(EL_1+EL_5)/2)$ in the arrow B direction in the Y-axis direction. As a result as shown in FIG. 2, the center position of the exposed region and the image-capturing center of the imaging unit 2 (or the center position of the aperture section 10a of the mask 10) match with each other. Then control proceeds to step S7.

On the other hand, in step S5, in the case where it is determined as "YES", control also proceeds to step S7.

In step S7, whether or not the exposed region of the pixel region 11 has been set in the exposure position of the exposure optical system 1 is determined. This is determined based on data stored in the memory section 14 namely: detection time $t_1$ for the first reference position; width W of the pixel region 11 in the transporting direction shown in FIG. 2; transporting velocity V; and distance D between the imaging position and the exposure position, by computing time t required for transporting the TFT substrate 6 by distance D after the imaging unit 2 has image-captured the center position of the pixel line, in the computing section 15, and by managing the time t. Here, when it is determined that time t has elapsed, in other words, the exposed region has been set in the exposure position (determined as "YES"), control proceeds to step S8.

In step S8, the lamp controller 16 starts and makes the light source 7 emit light for a preset predetermined period of time. In this case, since the TFT substrate 6 is moving at constant velocity, an edge in the transporting direction of the exposure pattern may become blurred in some cases. Therefore, the transporting velocity, exposure time, and power of the light source 7 are preset so that the amount of blur falls within an allowed value range.

In step S9, the left end pixel number n is counted in the left end pixel counting circuit 26 shown in FIG. 4. Then, control proceeds to step S10, and the left end pixel number n is compared with the exposure complete pixel line number N that was preset and stored in the memory section 14, by the comparison circuit 27, and whether or not both of values match is determined.

If it is determined as "NO" in step S10 of FIG. 7, control returns to step S1, and then shifts to the next reference position detection operation. In this case, a reading start signal from the imaging unit 2 resets the counting circuits 24A and 24B shown in FIG. 4.

On the other hand, if it is determined as "YES" in step S10, all exposure on the predetermined region of the TFT substrate 6 is finished, and an exposure complete signal shown in FIG. 4 resets the left end pixel counting circuit 26. Then, the transporting unit 3 returns the stage 3a to the starting position at high speed.

When the region that can be exposed by the exposure optical system 1 is narrower than the width of the TFT substrate 6, then when step S10 is completed, the stage 3a is step-moved by a predetermined distance in the Y-axis direction, and steps S1 through S10 are executed again to carry out exposure on a region adjacent to the region that has been exposed. The exposure optical system 1 and the imaging unit 2 may be arranged in a plurality of lines in the Y-axis direction so that the entire width of the TFT substrate 6 can be exposed at once. Moreover, if the image-capturing region of the imaging unit 2 for the exposed region is narrow, a plurality of the imaging unit 2 may be installed in a line in the Y-axis direction.

Furthermore, steps S1 through S10 have been described as a series of operations for the sake of description. However, detection of reference positions is carried out in parallel with execution of each of the above steps, and detection data is stored in the memory section 14 on demand. Therefore, adjustment of the angle ▪of the TFT substrate 6 in step S3, and Y-axis adjustment of the TFT substrate 6 in step S6 are executed within the time in which required data is read from the memory section 14 and the TFT substrate 6 moves from the last exposure position to the next exposure position.

Figure 5B:
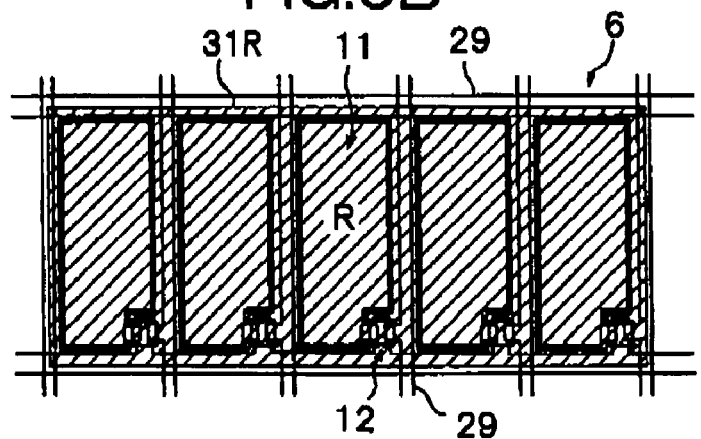
Figure 5C:
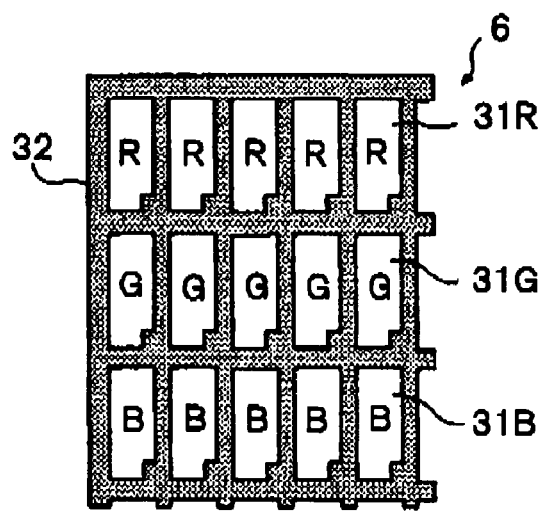

Thus, when exposure has been completed and after developing, by baking the TFT substrate at 200° C. to 230° C. for example, the red (R) color filter 31R for example is formed as shown in FIG. 5B and FIG. 5C. Furthermore, in the same manner as described above, green (G) and blue (B) color filters 31G and 31B are formed (refer to FIG. 5C).

Figure 13:
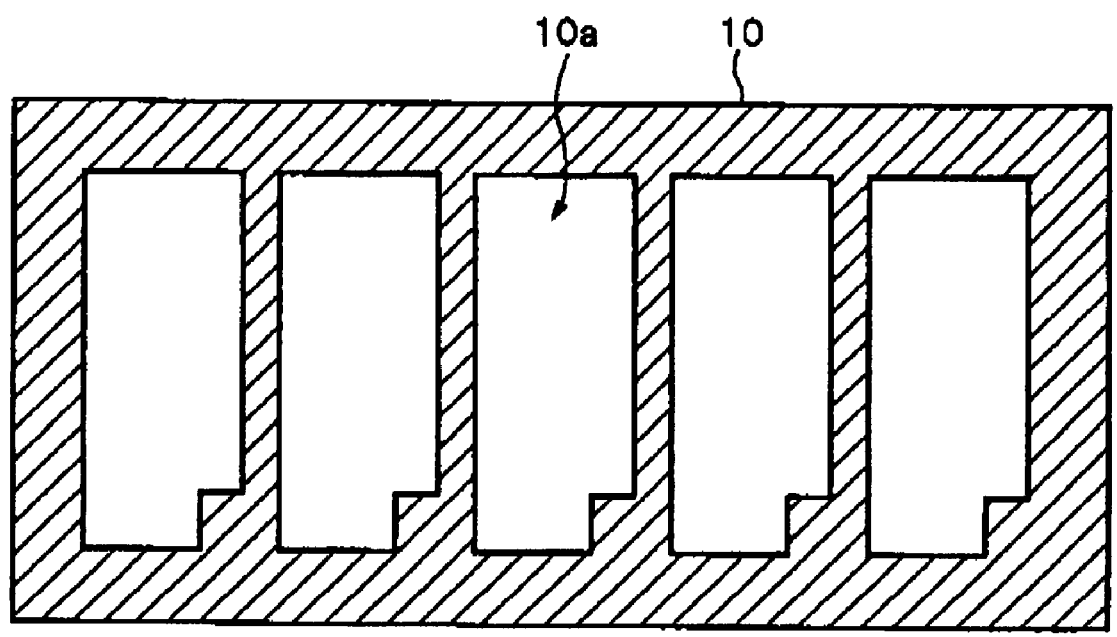
FIG. 13 is a plan view showing an example of a mask of a black matrix formed on the TFT substrate.

In a fourth step, for example, a positive type photosensitive black resist is applied by, e.g., coating onto the color filter. Then as shown in FIG. 5C, the photosensitive black resist (photosensitive material) is exposed to form a black matrix 32 that blocks light in a position that overlaps the TFT 12 and the wiring 29. In this case, the mask 10 of the black matrix 32 to be used is such that as shown in FIG. 13, the aperture sections 10a are horizontally lined up to correspond to the pixel regions 11 of the exposed region.

Figure 6D:
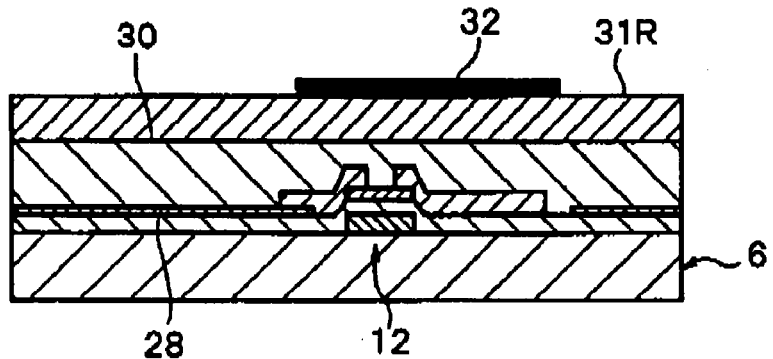
Figure 14:
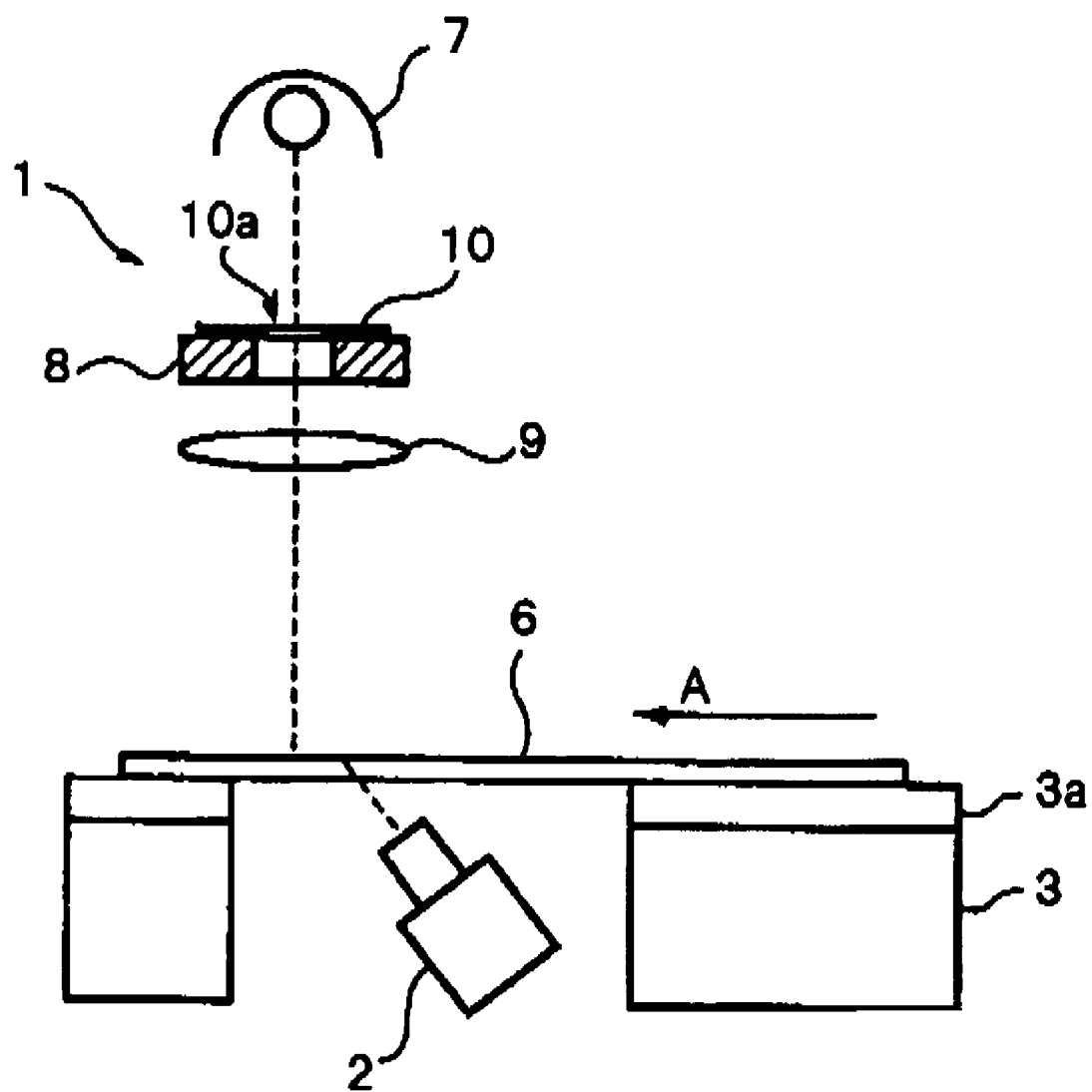
FIG. 14 is an explanatory drawing showing another configuration example of the exposure apparatus used in formation of the black matrix.

Since the photosensitive black resist is coated so as to cover the TFT substrate 6, the pixel region 11 cannot be image-captured from above the substrate. Therefore in this case, an exposure apparatus in which the imaging unit 2 is arranged below the stage 3a as shown in FIG. 14, and which is able to image capture the pixel region 11 through the substrate from below the TFT substrate 6, is employed. At this time, the exposure sequence is carried out in the same manner as in the third step. When exposure has been completed as described above, and the TFT substrate is baked after it has been developed, a substrate for a liquid crystal display in which the black matrix 32 is formed on the color filter as shown in FIG. 5C and FIG. 6D, is produced.

Moreover, the black matrix 32 is not limited to one that uses a photosensitive black resist and may be a metallic film such as a Cr film for example. In this case, for example a Cr film is formed on the color filters 31R, 31G, and 31B by means of sputtering or the like, the photoresist is coated on the Cr film to create a resist pattern of the black matrix 32 using the above exposure apparatus, and the Cr film is etched using the resist pattern as a mask. As a result, the Cr black matrix 32 can be formed.

As described above, according to the production method of a substrate for a liquid crystal display of the present invention, the pixel region 11 is image-captured while transporting the TFT substrate 6 at a predetermined velocity, the reference position preset in the image-captured pixel region 11 is detected, and exposure light irradiation timing is controlled based on the reference position. As a result, an exposure pattern of a color filter and black matrix can be formed in a predetermined position of the TFT substrate 6 at a high level of precision.

Figure 15:
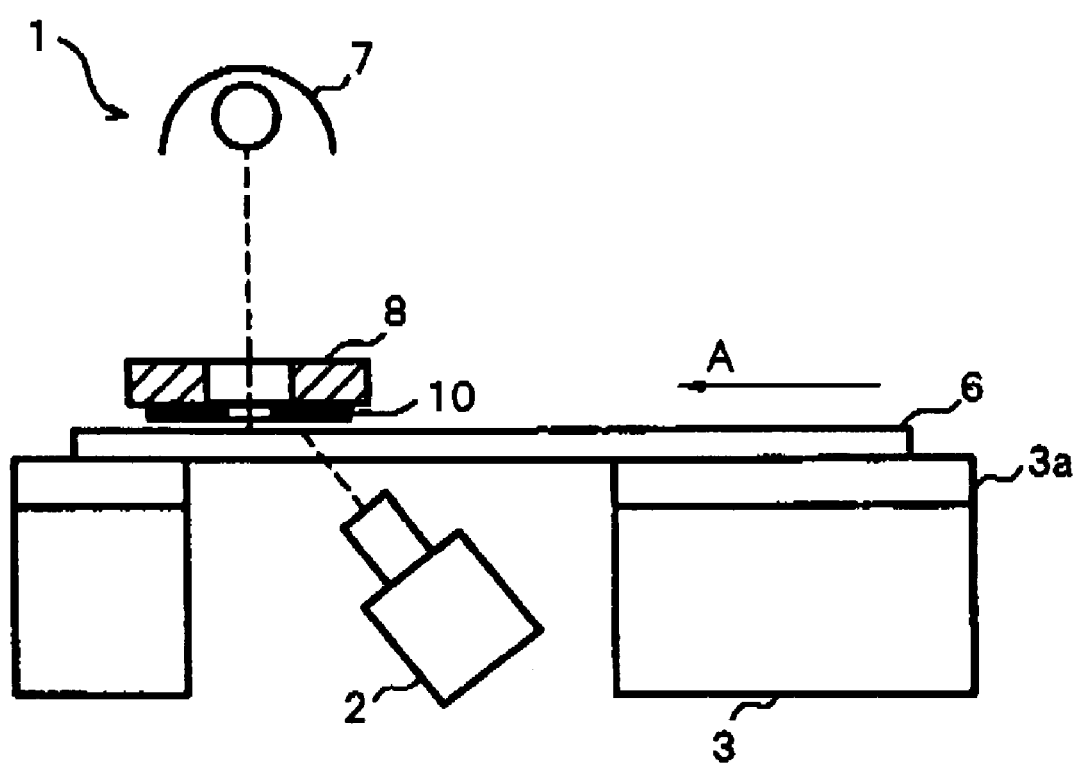
FIG. 15 is a schematic view showing still another configuration example of the exposure apparatus to be used for performing the production method of a substrate for a liquid crystal display according to the present invention.

The exposure apparatus used in the above embodiment image-captures an image of the mask 10 on the resist of the TFT substrate 6 through the imaging lens 9 where the mask 10 is sufficiently separated from the position on the TFT substrate 6 on which resist is coated. However, it is not limited to this, and for example as shown in FIG. 15, an exposure apparatus of a proximity exposure type in which the imaging unit 2 is arranged below the stage 3a to enable image-capturing of the pixel region 11 through the substrate from below the TFT substrate 6, and the mask 10 is arranged in the vicinity of the TFT substrate 6 on which resist has been coated, to print an image of the mask 10 on the resist of the TFT substrate 6, or an exposure apparatus of a contact exposure type in which the mask 10 and the TFT substrate 6 are brought in contact to directly expose an image of the mask 10 on the TFT substrate 6, may be employed. In either of the exposure apparatuses, the pixel region 11 is image-captured while transporting the TFT substrate 6 at a predetermined velocity, the reference position preset in the image-captured pixel region 11 is detected, and exposure light irradiation timing is controlled based on the reference position. As a result, an exposure pattern of a color filter and black matrix can be formed in a predetermined position of the TFT substrate 6 at a high level of precision.

Moreover, the above exposure apparatus is not limited to one that uses a mask, and for example it may be one where by laser beam scanning or driving a micro mirror array, a pattern of the color filters 31R, 31G, 31B or the black matrix 32 is directly exposed on the TFT substrate 6, or an exposure apparatus that image-captures the pixel region 11 by the imaging unit 2, detects the reference position preset in the pixel region 11, and controls exposure light based on the reference position.

It should be appreciated that the entire contents of Japanese Patent Application No. 2004-328322, filed on Nov. 12, 2004, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

I claim:

1. A method of producing a substrate for a liquid crystal display that exposes and forms a pattern of a color filter or a black matrix on a TFT substrate in which a thin film transistor is provided for each pixel, and a wiring for driving the thin film transistor is provided around the pixel, the method comprising the steps of:

applying photosensitive material of the color filter or the black matrix onto the TFT substrate;

image-capturing the pixel of the TFT substrate by a line CCD in which photodetectors are arranged in one line in a direction orthogonal to a transporting direction of the TFT substrate when the TFT substrate is transported at a constant velocity in one direction, the image-capturing position of the line CCD being on the near side of an exposure position of the pattern in the transporting direction of the TFT substrate;

detecting a reference position preset in a corner section of the pixel that has been image-captured;

irradiating with exposure light for a predetermined period of time, when the TFT substrate is transported by a predetermined distance after the reference position is detected and after an expected exposure position on the TFT substrate reaches the exposure position of the pattern; and exposing and forming the pattern of the color filter or the black matrix in the expected exposure position on the TFT substrate.

2. The method of producing a substrate for a liquid crystal display according to claim 1, wherein the step of detecting the reference position is performed by binarization processing the image of the image-captured pixel, and comparing image data of the binarized pixel with image data corresponding to the preset and pre-stored reference position, and detecting a portion where both of the image data match.

\* \* \* \* \*

UNITED STATES PATENT AND TRADEMARK OFFICE
CERTIFICATE OF CORRECTION

| | | |
|---|---|---|
| PATENT NO. | : 7,812,920 B2 | Page 1 of 1 |
| APPLICATION NO. | : 11/798287 | |
| DATED | : October 12, 2010 | |
| INVENTOR(S) | : Jin Iino | |

It is certified that error appears in the above-identified patent and that said Letters Patent is hereby corrected as shown below:

On the Title Page, Item (54), in the Title, line 5, "PRESENT" should read --PRESET--.

Signed and Sealed this
First Day of February, 2011

David J. Kappos
*Director of the United States Patent and Trademark Office*

UNITED STATES PATENT AND TRADEMARK OFFICE
CERTIFICATE OF CORRECTION

PATENT NO. : 7,812,920 B2
APPLICATION NO. : 11/798287
DATED : October 12, 2010
INVENTOR(S) : Jin Iino It is certified that error appears in the above-identified patent and that said Letters Patent is hereby corrected as shown below:

On the Title Page, Item (54), line 5 and at Column 1, line 5, in the Title, "PRESENT" should read --PRESET--.

This certificate supersedes the Certificate of Correction issued February 1, 2011.

Signed and Sealed this
First Day of March, 2011

David J. Kappos
*Director of the United States Patent and Trademark Office*